(12) United States Patent
Kim et al.

(10) Patent No.: US 12,424,269 B2
(45) Date of Patent: Sep. 23, 2025

(54) SEMICONDUCTOR MEMORY DEVICE CAPABLE OF ADAPTIVELY CONTROLLING BIAS AND METHOD OF OPERATING THE SAME

(71) Applicant: SAMSUNG ELECTRONICS CO., LTD., Suwon-si (KR)

(72) Inventors: Sun Young Kim, Suwon-si (KR); Sang-Yun Kim, Suwon-si (KR); Younghun Seo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 208 days.

(21) Appl. No.: 18/199,114

(22) Filed: May 18, 2023

(65) Prior Publication Data

US 2024/0096401 A1 Mar. 21, 2024

(30) Foreign Application Priority Data

Sep. 20, 2022 (KR) .................. 10-2022-0118854

(51) Int. Cl.
| | |
|---|---|
| G11C 5/02 | (2006.01) |
| G11C 11/408 | (2006.01) |
| G11C 11/4091 | (2006.01) |
| H10B 12/00 | (2023.01) |

(52) U.S. Cl.
CPC ...... *G11C 11/4091* (2013.01); *G11C 11/4085* (2013.01); *H10B 12/50* (2023.02)

(58) Field of Classification Search
CPC . G11C 11/4091; G11C 11/4085; G11C 5/025; G11C 8/14; G11C 7/04; G11C 11/4074; G11C 5/146; H10B 12/50

USPC .......................................................... 365/205
See application file for complete search history.

(56) References Cited

U.S. PATENT DOCUMENTS

| | | | |
|---|---|---|---|
| 7,335,936 B2 | 2/2008 | Sommer et al. | |
| 7,824,982 B2 | 11/2010 | Forbes | |
| 9,214,932 B2 | 12/2015 | Clausen et al. | |
| 9,355,736 B1 | 5/2016 | Ratnam | |
| 2005/0048714 A1 | 3/2005 | Noble | |
| 2011/0156807 A1* | 6/2011 | Kim | G11C 5/14 327/538 |
| 2012/0119286 A1* | 5/2012 | Kim | H10D 30/611 257/329 |
| 2016/0064079 A1 | 3/2016 | Alsmeier | |
| 2016/0343450 A1* | 11/2016 | Lee | G11C 16/10 |
| 2022/0020436 A1* | 1/2022 | Choi | G11C 16/3459 |

FOREIGN PATENT DOCUMENTS

CN 103986449 A 8/2014

* cited by examiner

*Primary Examiner* — Huan Hoang
(74) *Attorney, Agent, or Firm* — Muir Patent Law, PLLC

(57) ABSTRACT

A semiconductor memory device is provided which is capable of adaptively controlling bias and a method of operating the same. The semiconductor memory device includes: a memory cell area including a plurality of first transistors to which a first bias voltage is applied; and a peripheral circuit area which overlaps the memory cell area in a first direction and includes a plurality of second transistors to which a second bias voltage controlled differently from the first bias voltage is applied.

18 Claims, 9 Drawing Sheets

SEMICONDUCTOR MEMORY DEVICE CAPABLE OF ADAPTIVELY CONTROLLING BIAS AND METHOD OF OPERATING THE SAME

CROSS-REFERENCE TO RELATED PATENT APPLICATION

Korean Patent Application No. 10-2022-0118854, filed on Sep. 20, 2022, in the Korean Intellectual Property Office is incorporated herein in its entirety by reference.

BACKGROUND

1. Field

The present disclosure relates to a semiconductor memory device and more particularly, to a semiconductor memory device which is capable of controlling bias adaptively to a desired operating condition or operating environment and a method of operating the same.

2. Description of the Related Art

A semiconductor memory device operates by using a voltage applied externally or a voltage generated internally. Here, a constant bias voltage may be used to control a corresponding element to be operated within a certain operating range. For example, in a semiconductor memory device, a back bias voltage (VBB) is applied to a body of an NMOS transistor and a boosted voltage (VPP) is applied to a body of a PMOS transistor so that an on-current required by each transistor may be driven.

Recently, an operating condition or an operating environment required for a semiconductor device is diversifying. In this regard, there is a demand for control on a bias voltage of a semiconductor memory device that may be optimized for an operating condition or an operating environment for securing operating reliability.

SUMMARY

Embodiments are directed to a semiconductor memory device that is capable of adaptively controlling its bias as well as a method of operating such a semiconductor memory device.

The present disclosure provides a semiconductor memory device which may control bias adaptively to a required operating condition or operating environment and may secure operating reliability, and a method of operating the same.

According to an embodiment, there is provided a semiconductor memory device includes: a memory cell area including a plurality of first transistors to which a first bias voltage is applied; and a peripheral circuit area which overlaps the memory cell area in a first direction and includes a plurality of second transistors to which a second bias voltage controlled differently from the first bias voltage is applied.

According to an embodiment, there is provided a method of operating a semiconductor memory device having a cell on periphery structure, in which a memory cell area and a peripheral circuit area are stacked and overlapped in a first direction. The method includes: applying a first bias voltage to first transistors of the memory cell area, in response to a first instruction; and applying a second bias voltage, which is different from the first bias voltage, to second transistors performing operation corresponding to the first instruction in the peripheral circuit area.

According to an embodiment, there is provided a dynamic random access memory including: a memory cell area including a plurality of vertical channel transistors; and a peripheral circuit area disposed on and overlapping the memory cell area in a first direction, and including a plurality of transistors, wherein at least two different bias voltages are applied to at least one of the transistors.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
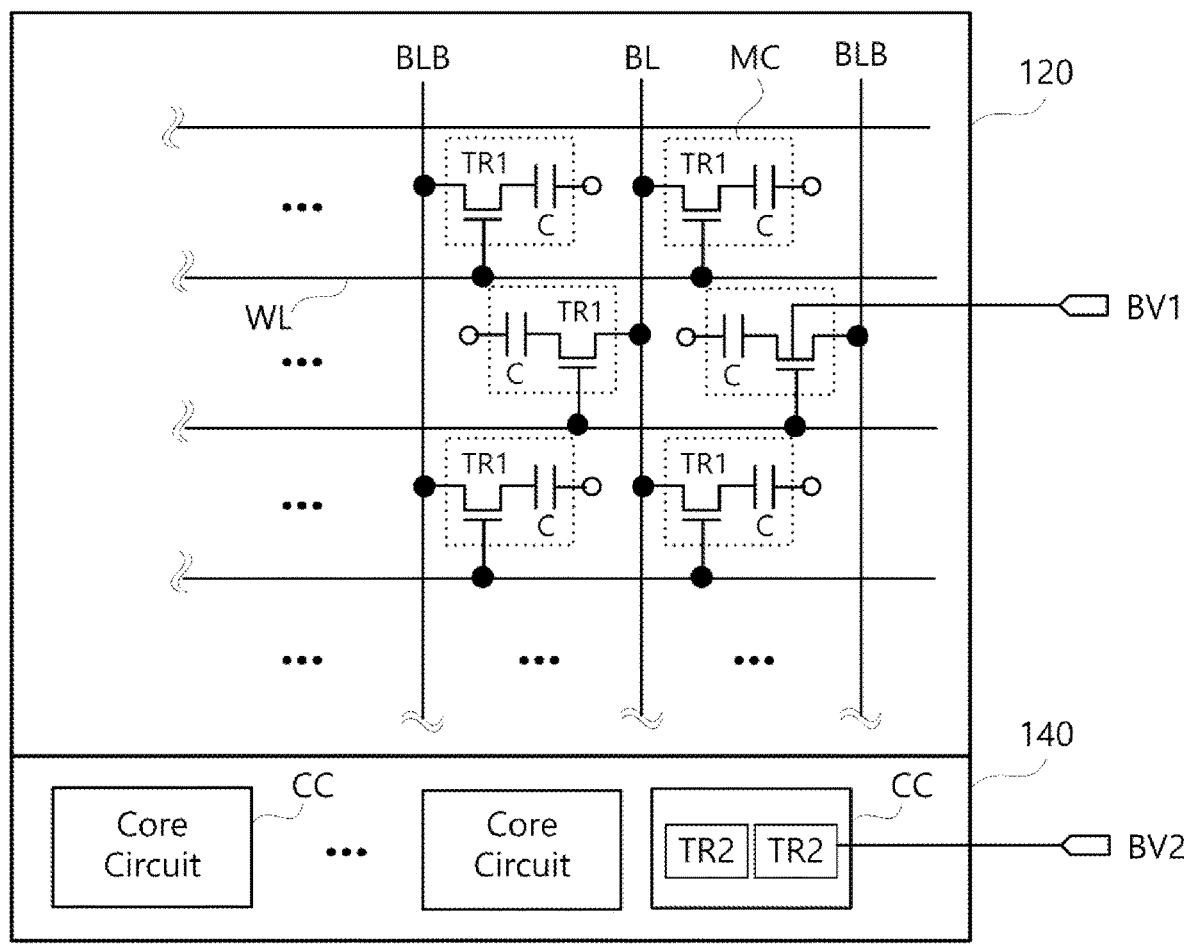
FIG. 1 illustrates a semiconductor memory device according to an example embodiment.

Example embodiments will now be described more fully hereinafter with reference to the accompanying drawings; however, one or more embodiments may be embodied in different forms and should not be construed as limited to the embodiments set forth herein. Rather, these embodiments are provided so that this disclosure will be thorough and complete, and will fully convey exemplary implementations to those skilled in the art.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout. The term "overlap" or "overlapping" may indicate that a layer is either above or below another layer while being located at least partially in the same area with respect to a reference direction, e.g., a vertical direction. It will be understood that when a layer is referred to as "overlapping" another layer, it can be directly over or under that layer or one or more intervening layers may be present.

Figure 2:
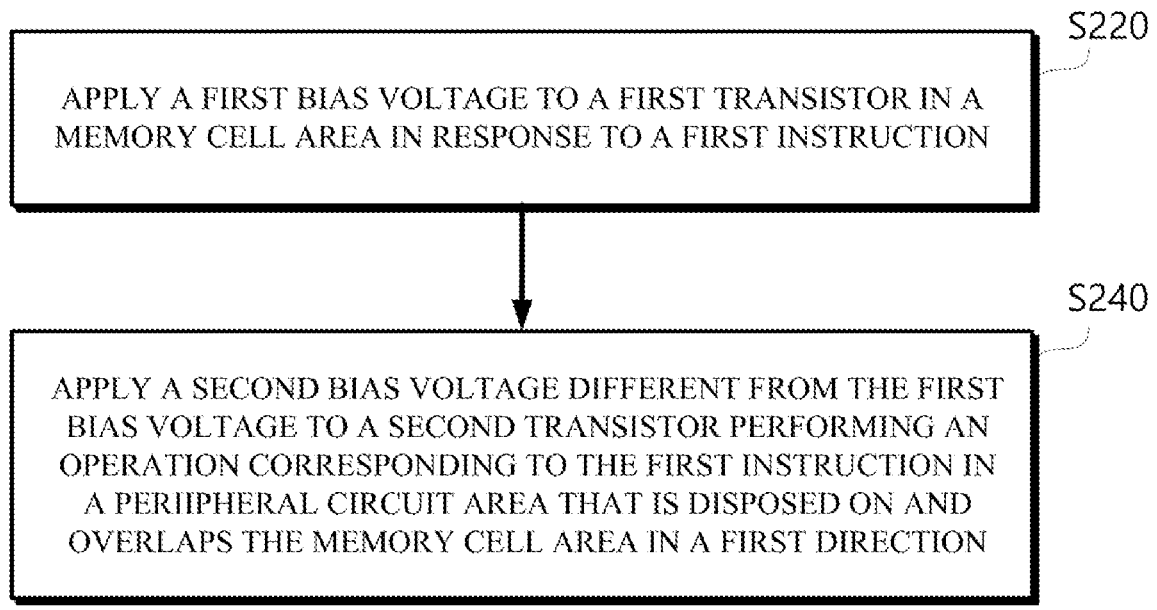
FIG. 2 is a flowchart illustrating a method of operating a semiconductor device according to an example embodiment.

FIG. 1 illustrates a semiconductor memory device 100 according to an example embodiment and FIG. 2 is a flowchart illustrating a method 200 of operating a semiconductor device according to an example embodiment.

Referring to FIGS. 1 and 2, the semiconductor memory device 100 includes a memory cell area 120 and a peripheral circuit area 140. The memory cell area 120 includes a plurality of first transistors TR1s and the peripheral circuit area 140 includes a plurality of second transistors TR2s. Here, a first bias voltage BV1 applied to the first transistors TR1s and a second bias voltage BV2 applied to the second transistors TR2s are controlled differently from each other, and thus, operating reliability of the semiconductor memory device 100 may be secured according to various operating conditions or operating environments.

The semiconductor memory device 100 according to the example embodiment may be a Dynamic Random Access Memory (DRAM). Also, voltages explained with respect to the disclosed circuits may be generated by an internal voltage generator (not illustrated) or may be generated by performing fixed modulation of the voltage generated by the internal voltage generator.

The method 200 of operating a semiconductor memory device according to an example embodiment includes applying a first bias voltage to a first transistor in a memory cell area in response to a first instruction in operation S220 and applying a second bias voltage, which is different from the first bias voltage, to a second transistor performing an operation corresponding to the first instruction in a peripheral circuit area in operation S240. Accordingly, operating reliability of the semiconductor memory device may be secured according to various operating conditions or operating environments. Here, the first instruction may be a write instruction, a read instruction, or a precharge instruction.

Hereinafter, the semiconductor memory device 100 according to a disclosed embodiment is operated by using the method 200 of operating a semiconductor memory device according to the disclosed embodiment. The method 200 of operating a semiconductor memory device according to the disclosed embodiment is executed in the semiconductor memory device 100 according to the disclosed embodiment. However, the present disclosure is not limited thereto and the semiconductor memory device 100 according to the disclosed embodiments may be operated by using a method different from the disclosed method 200 of operating a semiconductor memory device. Also, the method 200 of operating a semiconductor memory device according to the disclosed embodiment may be executed in a semiconductor memory device different from the semiconductor memory device 100.

Referring to FIGS. 1 and 2, the memory cell area 120 of the semiconductor memory device 100 according to the disclosed embodiment includes a plurality of memory cells MC. The memory cells MC may each include the transistor TR1 and a capacitor C. In this embodiment, one end of the first transistor TR1 is connected to a bit line BL or a bit line bar BLB and a gate of the first transistor TR1 is connected to a word line WL. The other end of the first transistor TR1 may be connected to the capacitor C. The first transistor TR1 may be an NMOS transistor and may function as an access transistor. That is, the first transistor TR1 is turned on by a voltage applied to the word line WL and data may be written to the capacitor C according to a voltage applied to the bit line BL or a complementary bit line BLB. Also, data may be read from the capacitor C. However, the semiconductor device 100 is not limited thereto, and may implement other types of memory devices not including the capacitor C.

The first bias voltage BV1 may be applied to a body of the first transistor TR1 in operation S220 so that the first transistor TR1 may operate within a predetermined range. For example, a back bias voltage VBB may be applied as the first bias voltage BV1 so as to control a threshold voltage of the first transistor TR1 according to the operating characteristic of the semiconductor memory device 100. Hereinafter, unless otherwise noted, it is assumed that the first bias voltage BV1 is the back bias voltage VBB.

According to an embodiment, the peripheral circuit area 140 may be formed to overlap the memory cell area 120 and may be disposed below the memory cell area 120 in a first direction. For example, the first direction may be a vertical direction.

Figure 3:
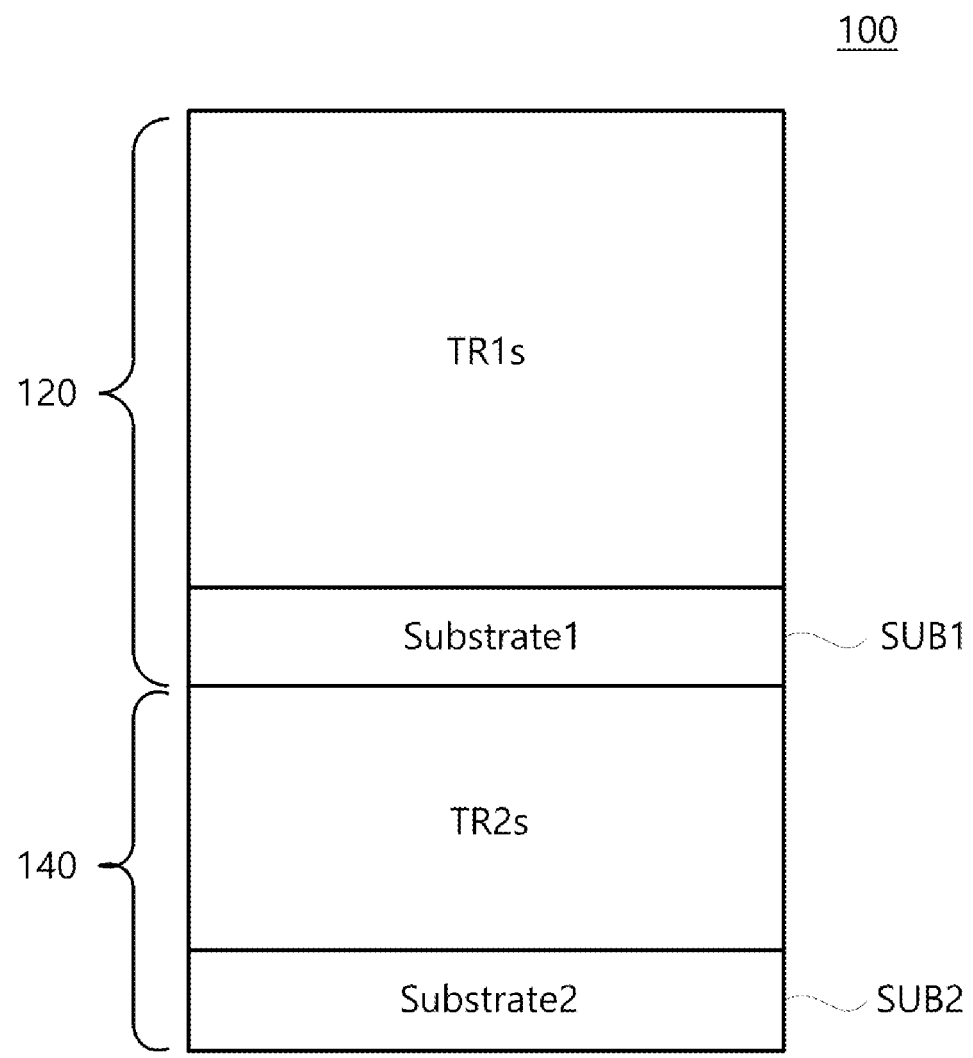
FIG. 3 is an exemplary semiconductor memory device having a cell on periphery (COP) structure where a memory cell area and a peripheral circuit area are stacked and overlapped in a first direction.

FIG. 3 is an exemplary semiconductor memory device 100 having a cell-on-periphery (COP) structure where the memory cell area 120 and the peripheral circuit area 140 are stacked and overlapped in the first direction.

Referring to FIGS. 1 and 3, the semiconductor memory device 100 according to the disclosed embodiments may have a COP structure. That is, the plurality of first transistors TR1s of the memory cell area 120 may be formed on a first substrate SUB1 and the plurality of second transistors TR2s of the peripheral circuit area 140 may be formed on a second substrate SUB2. Here, the first substrate SUB1 may be disposed above the second substrate SUB2 in the first direction, that is, a vertical direction. However, the present disclosure is not limited thereto and in alternate embodiments the second substrate SUB2 may be disposed above the first substrate SUB1 in a vertical direction.

As the peripheral circuit area 140 is formed on the second substrate SUB2 which is different from the first substrate SUB1 on which the memory cell area 120 is formed, a limitation on a design rule may be lightened for the peripheral circuit area 140 and control on the second bias voltage BV2 may be realized regardless of the first bias voltage BV1. Accordingly, operating reliability of the semiconductor memory device 100 may be secured in various operating conditions or operating environments. For example, in a vertical-channel-transistor (VCT) DRAM, it is difficult to apply a bias voltage to the VCTs because channels of these transistors are fabricated to be vertically stacked. Accordingly, additional space may be needed to implement a separate circuit to apply body bias (i.e., an example of a limitation on design rule described above), and thus a complex fabrication process may be needed to apply bias voltages to these types of transistors. Accordingly, by forming the memory cell area 120 and the peripheral circuit area 140 on the first and second substrates, and each capable of having different bias voltages applied, the semiconductor memory device 100 according to one or more embodiments may be provided with more flexibility to adjust threshold voltages and off-current for certain types of transistors, and improve Process-Voltage-Temperature (PVT) variation and IDD3 (i.e., active standby current or active power-down current according to JEDEC standards (e.g., LPDDR, DDR, GDDR)).

Referring back to FIGS. 1 and 2, the peripheral circuit area 140 may include various core circuits CCs such as a bit line sense amplifier or a sub word line driver. The core circuits CCs may each include at least one second transistor TR2. The second transistors TR2s may be NMOS transistors or PMOS transistors.

The second bias voltage BV2 may be applied to a body of the second transistor TR2 in operation S240 so that the second transistor TR2 may be operated with a required operating characteristic. Here, the second bias voltage BV2 may be controlled differently from the first bias voltage BV1. For convenience of description, FIG. 1 illustrates that the first bias voltage BV1 and the second bias voltage BV2 are respectively applied to one transistor, however, these voltages may be applied to each of the transistors of the respective types.

Each different operating characteristic may be applied to the first transistors TR1s and the second transistors TR2s, respectively. For example, in order to minimize the number of first-type defective cells in the memory cell area 120, the first bias voltage BV1 applied to the first transistor TR1, that is, a cell transistor, needs to be raised. Here, assuming that the second bias voltage BV2 is controlled in the same manner as the first bias voltage BV1, the second bias voltage BV2 applied to the second transistor TR2 in the peripheral circuit area 140 increases as the first bias voltage BV1 increases. Accordingly, a threshold voltage of the NMOS transistor may increase in the second transistor TR2 and thereby, its pull-down speed may slow down. As a result, one of the operating characteristics such as Row Address to Column Address Delay (tRCD) may be increased, thereby degrading the performance of the semiconductor memory device 100.

Alternatively or additionally, when the first bias voltage BV1 for the first transistor TR1 is lowered in order to minimize the number of second-type defective cells, which are different from the first-type, in the memory cell area 120, the second bias voltage BV2 applied to the second transistor TR2 of the peripheral circuit area 140 is also lowered. In this regard, a threshold voltage of the NMOS transistor may be lowered in the second transistor TR2 and thereby, transition speed may be improved. However, a leakage current may increase while the NMOS transistor is turned off.

In the semiconductor memory device 100 according to the disclosed embodiments, the memory cell area 120 and the peripheral circuit area 140 overlap each other in a vertical direction and thus, there is a lower limitation on a design rule. Accordingly, the second bias voltage BV2 may be easily and accurately controlled for the second transistors TR2s in the core circuit CC, separately from the first bias voltage BV1 for the first transistors TR1s of the memory cell area 120. Therefore, the semiconductor memory device 100 may be operated with an optimized operating characteristic.

For example, in order to reduce the defects occurring due to a temperature increase and/or a leakage current, the semiconductor memory device 100 according to the disclosed embodiments may adaptively apply the second bias voltage BV2 to the second transistors TR2s in the core circuit CC.

For example, the back bias voltage VBB may be applied as the first bias voltage BV1 to the body of the first transistor TR1 and a ground voltage, a power voltage, or an operating voltage of the core circuits CCs where the second transistors TR2s are included may be applied as the second bias voltage BV2 to the body of the second transistor TR2. In this case, a threshold voltage of the second transistor TR2 is lowered by the second bias voltage BV2 and thus, on-off conversion speed is improved. Also, a voltage applied to a source/drain and the body of the second transistor TR2 is equal to a ground voltage, a power voltage, or an operating voltage so that a leakage current occurring due to a difference in the voltages of the source/drain and the body may not be generated at an off-state.

Hereinafter, the second bias voltage BV2 for the core circuits CCs will be described in more detail.

Figure 4:
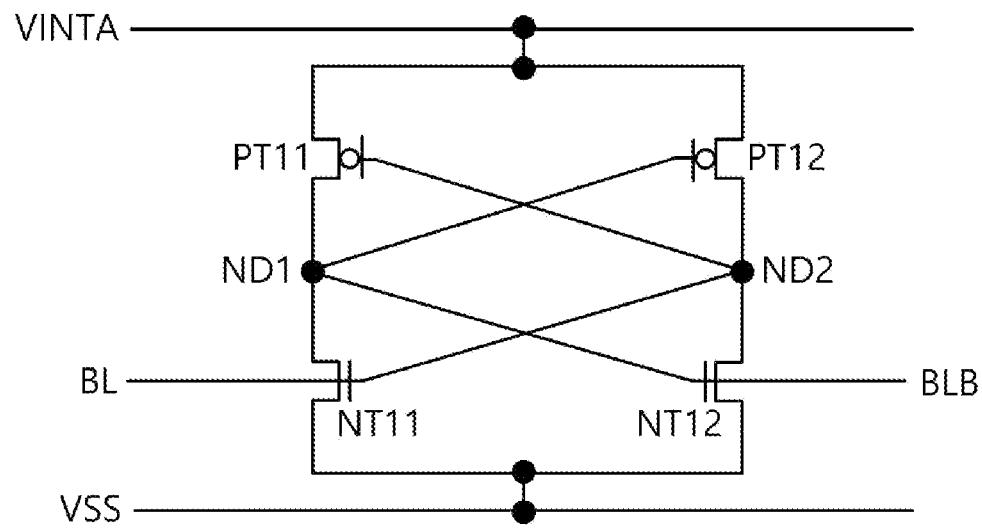
FIG. 4 illustrates a bit line sense amplifier according to an example embodiment.

FIG. 4 illustrates a bit line sense amplifier BLSA according to an example embodiment.

Referring to FIGS. 1 and 4, the bit line sense amplifier BLSA, which is part of a core circuit CC disposed in the peripheral circuit area 140 according to the disclosed embodiments, may sense and amplify a potential difference of the bit line BL and the bit line bar BLB to output data stored in the capacitor C. In this regard, the bit line sense amplifier BLSA may include a pair of PMOS transistors PT11 and PT12 and a pair of NMOS transistors NT11 and NT12.

The PMOS transistor PT11 and the PMOS transistor PT12 may each include one end, to which an operating voltage VINTA is applied. The other end of the PMOS transistor PT11 may be connected to a first node ND1 and the other end of the PMOS transistor PT12 may be connected to a second node ND2. Gates of the PMOS transistor PT11 and the PMOS transistor PT12 may be cross-coupled to the first node ND1 and the second node ND2. For example, a gate of the PMOS transistor PT11 may be connected to the second node ND2 and a gate of the PMOS transistor PT12 may be connected to the first node ND1. The NMOS transistor NT11 and the NMOS transistor NT12 may each include one end connected to a ground voltage VSS. The other end of the NMOS transistor NT11 may be connected to the first node ND1 and the other end of the NMOS transistor NT12 may be connected to the second node ND2. Gates of the NMOS transistors NT11 and NT12 may be cross-coupled to the first node ND1 and the second node ND2. For example, a gate of the NMOS transistor NT11 may be connected to the second node ND2 and a gate of the NMOS transistor NT12 may be connected to the first node ND1. In addition, the gate of the NMOS transistor NT11 may be connected to the bit line BL and the second node ND2 and the gate of the NMOS transistor NT12 may be connected to the bit line bar BLB and the first node ND1.

The second bias voltage BV2 may be applied to the PMOS transistors PT11 and PT12 and the bodies of the NMOS transistors NT11 and NT12. The operating voltage VINTA of the bit line sense amplifier BLSA may be applied to bodies of the PMOS transistors PT11 and PT12 and the ground voltage VSS may be applied as the second bias voltage BV2 to the bodies of the NMOS transistors NT11 and NT12. Accordingly, as described above, a leakage current occurring due to a difference in the voltages of the source/drain and the bodies of each transistor connected to the bit line sense amplifier BLSA may not be generated at an off-state.

Also, as the ground voltage VSS which is the second bias voltage BV2 applied to the NMOS transistor NT11 and the NMOS transistor NT12 is typically higher than the back bias voltage VBB of about −1.5V, the threshold voltages of the NMOS transistor NT11 and the NMOS transistor NT12 may be lower than the case when the back bias voltage VBB is applied. Accordingly, pull-down speed of the NMOS transistor NT11 and the NMOS transistor NT12 may be improved to reduce the time of the off-state and thus, a leakage current may be reduced at the off-state in a first time interval. In addition, a characteristic of the first transistor TR1 may be maintained and operating speed of the bit line sense amplifier BLSA may be improved.

Here, in order to reduce defects occurring due to a temperature increase and/or a leakage current, the second bias voltage BV2, which is lower by a first value than the ground voltage VSS, may be applied to the NMOS transistor NT11 and the NMOS transistor NT12 in the second transistors TR2s, and the second bias voltage BV2, which is higher by a second value than the operating voltage VINTA, may be applied to the PMOS transistor PT11 and the PMOS transistor PT12 in the second transistors TR2s.

When the temperature sensed for the semiconductor memory device 100 is increased above a first reference temperature, the first value or the second value may correspond to a difference between the second bias voltage BV2 at the normal temperature and the second bias voltage BV2 at the increased temperature. Here, the difference (i.e., the first value or the second value) may be reflected by an internal voltage generator that generates power to be supplied to various components of the semiconductor device 100. In an embodiment, the first value and the second value may be the same. For example, the first value and the second value may be about 200 to 300 mV. However, the various embodiments of the present disclosure are not limited thereto. For example, the first value and the second value may be different from each other and/or may have values other than 200 to 300 mV according to operating characteristics of the PMOS transistors PT11 and PT12 and the NMOS transistors NT11 and NT12 in the bit line sense amplifier BLSA. In addition, a temperature of the semiconductor device 100 may be detected or measured by a temperature sensor disposed inside or outside the semiconductor memory device 100. For example, the temperature sensor may detect a current operating temperature of the semiconductor memory device 100. The detected temperature of the semiconductor may be compared to the first reference temperature to determine the first value and/or the second value. Here, the comparison may be performed by the temperature sensor, or may be performed by a logic circuit different from the temperature sensor. In such case, the temperature sensor may transmit the detected temperature to a relevant logic circuit to perform comparison of the detected temperature and the first reference temperature. In addition, a temperature sensor may be configured to detect or measure temperature for one or more components included in the semiconductor memory device 100.

By applying the second bias voltage BV2 to raise the threshold voltages of the PMOS transistors PT11 and PT12 and the NMOS transistors NT11 and NT12, a leakage current in the off-state may be reduced.

As described above, regardless of the first bias voltage BV1 applied to the first transistors TR1s, the semiconductor memory device 100 according to the disclosed embodiments applies the optimized second bias voltages BV2 to the PMOS transistors PT11 and PT12 and the NMOS transistors NT11 and NT12 in the bit line sense amplifier BLSA so that operating speed may be improved and defects occurring due to a temperature increase or a leakage current may be reduced. In addition, in the semiconductor memory device 100 according to the disclosed embodiments, the power consumption may be reduced.

Figure 5:
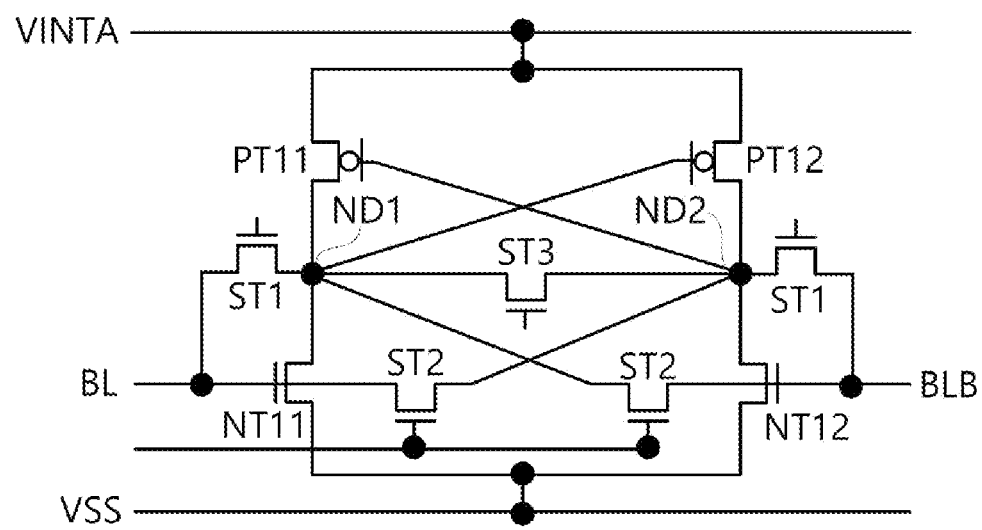
FIG. 5 illustrates a bit line sense amplifier including a switch transistor according to an example embodiment.

FIG. 5 illustrates the bit line sense amplifier BLSA including a switch transistor according to example embodiments.

Referring to FIGS. 1 and 5, the bit line sense amplifier BLSA, which is included in a core circuit CC disposed in the peripheral circuit area 140 according to the disclosed embodiments, may include the pair of PMOS transistors PT11 and PT12 and the pair of NMOS transistors NT11 and NT12 as the second transistors TR2s. In addition, the bit line sense amplifier BLSA of FIG. 5 may further include a pair of first switch transistors ST1s, a pair of second switch transistors ST2s, and a third switch transistor ST3, among the second transistors TR2s.

The first switch transistors ST1s and the second switch transistors ST2s may be used to remove offsets of the PMOS transistors PT11 and PT12 and NMOS transistors NT11 and NT12. For example, the offsets of the pair of PMOS transistors PT11 and PT12 may be generated when the sizes thereof vary or the threshold voltages thereof vary according to errors in the processes, similarly to the pair NMOS transistors NT11 and NT12.

The first switch transistors ST1s may each be the NMOS transistor in which the gate of the corresponding transistor from among the NMOS transistor NT11 and the NMOS transistor NT12 is connected to one of the first node ND1 and the second node ND2. The second switch transistors ST2s may be the NMOS transistors in which one end thereof is respectively connected to each other and the other end thereof is respectively connected to the corresponding transistor from among the NMOS transistor NT11 and the NMOS transistor NT12.

The third switch transistor ST3 may be the NMOS transistor connected between the first node ND1 and the second node ND2. The third switch transistor ST3 may be used to precharge the first node ND1 and the second node ND2 after the offsets of the bit line sense amplifier BLSA are removed by the first switch transistors ST1s and the second switch transistors ST2s.

Also, in order to reduce the defects occurring due to a temperature increase or a leakage current, the second bias voltage BV2, which is different from the first bias voltage BV1, may be applied to the first switch transistors ST1s through the third switch transistor ST3.

As illustrated in FIG. 5, when the first switch transistors ST1s through the third switch transistor ST3 are NMOS transistors, the second bias voltage BV2 may be applied to the first switch transistors ST1s through the third switch transistor ST3 as the ground voltage VSS as described above. Also, when the temperature of the semiconductor memory device 100 is increased above the first reference temperature, the second bias voltage BV2 may be determined to be less than the ground voltage VSS by the first value, and the second bias voltage BV2 may be applied to the first switch transistors ST1s through the third switch transistor ST3.

Accordingly, in the semiconductor memory device 100 according to the disclosed embodiments, the defects occurring due to a temperature increase or a leakage current may be reduced. In this regard, in the semiconductor memory device 100 according to the disclosed embodiments, the consumed power may be reduced. FIG. 5 illustrates that the bit line sense amplifier BLSA according to a disclosed embodiment includes all of the first switch transistors ST1s through the third switch transistor ST3, however, may only include a part of the switch transistors as necessary.

Figure 6:
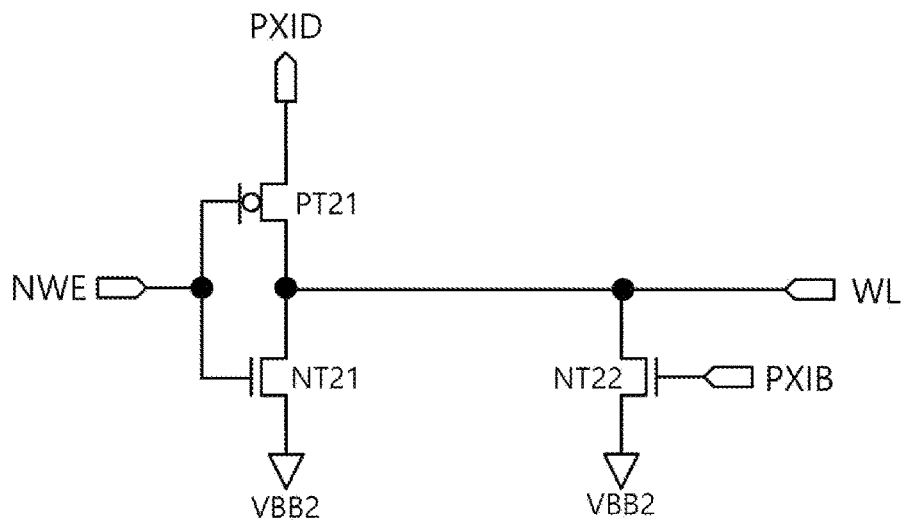
FIG. 6 illustrates a sub word line driver according to an example embodiment.

FIG. 6 illustrates a sub word line driver SWD according to an example embodiment.

Referring to FIGS. 1 and 6, the sub word line driver SWD according to the disclosed embodiment may include a PMOS transistor PT21, an NMOS transistor NT21, and an NMOS transistor NT22 as the second transistors TR2s. One end of the PMOS transistor PT21 and one end of the NMOS transistor NT21 may each be connected to the word line WL. A word line control signal NWE may be applied to gates of the PMOS transistor PT21 and the NMOS transistor NT21. Accordingly, the PMOS transistor PT21 and the NMOS transistor NT21 may be alternately turned on or turned off. For example, when the word line control signal NWE is at a low level ("0"), the PMOS transistor PT21 may be turned on and the NMOS transistor NT21 may be turned off. A first operating signal PXID may be applied to the other end of the PMOS transistor PT21 and a power voltage VBB2 may be applied to the other end of the NMOS transistor NT21. In one embodiment, when the back bias voltage (VBB) is about −1.5V, the power voltage VBB2 may be about −0.7V.

When the word line WL connected to the sub word line driver SWD is selected, the sub word line driver SWD is activated by the word line control signal NWE and the voltage of the word line WL may be raised to a boosted voltage VPP (not illustrated), by the first operating signal PXID. When the word line WL connected to the sub word line driver SWD is not selected, the power voltage VBB2 may be applied to the word line WL.

The NMOS transistor NT22 may include one end connected to the word line WL the other end connected to the power voltage VBB2 and may be turned on or turned off by a second operating signal PXIB applied to a gate of the NMOS transistor NT22. The second operating signal PXIB may be an inverted signal of the first operating signal PXID. Accordingly, when the word line WL connected to the sub word line driver SWD is not selected, the NMOS transistor NT22, along with the NMOS transistor NT21, may stably maintain the voltage of the word line WL to be the power voltage VBB2 or may rapidly perform precharging operation.

The second bias voltage BV2 may be applied to the PMOS transistor PT21 and bodies of the NMOS transistors NT21 and NT22. The boosted voltage VPP, which is an operating voltage of the sub word line driver SWD, may be applied to a body of the PMOS transistor PT21 and the power voltage VBB2 may be applied to the bodies of the NMOS transistors NT21 and NT22 as the second bias voltage BV2.

Accordingly, as described above, a leakage current occurring due to a difference in the voltages of the source/drain and the bodies of each transistor in the sub word line driver SWD may not be generated at an off-state.

Also, if the power voltage VBB2, which is the second bias voltage BV2 applied to the NMOS transistor NT21 and the NMOS transistor NT22, is higher than the back bias voltage VBB of about −1.5V, the threshold voltages of the NMOS transistor NT21 and the NMOS transistor NT22 may be lower than the case when the back bias voltage VBB is applied. Accordingly, pull-down speed of the NMOS transistor NT21 and the NMOS transistor NT22 may be improved to reduce a leakage current at an off-state in the first time interval. In addition, a characteristic of the first transistor TR1 may be maintained and operating speed of the sub word line driver SWD may be improved.

In order to reduce the defects occurring due to a temperature increase or the defects occurring due to a leakage current, the second bias voltage BV2, which is lower by a third value than the power voltage VBB2, may be applied to the NMOS transistor NT21 and the NMOS transistor NT22 in the second transistors TR2s, and the second bias voltage BV2, which is higher by a fourth value than the boosted voltage VPP, may be applied to the PMOS transistor PT21 in the second transistors TR2s.

When the temperature sensed for the semiconductor memory device 100 is raised above the first reference temperature, the third value or the fourth value may be determined. The third value or the fourth value may correspond to a difference between the second bias voltage BV2 at the normal temperature and the second bias voltage BV2 at the raised temperature. The third value and the fourth value may be reflected by an internal voltage generator (not illustrated) when generating the second bias voltage BV2. In an embodiment, the third value and the fourth value may be the same as each other. For example, the third value and the fourth value may be about 200 to 300 mV. Also, the third value and the fourth value may be the same as the first value and the second value described above. However, the present disclosure is not limited thereto. For example, the third value and the fourth value may be different from each other or may have values other than 200 to 300 mV according to operating characteristics required to the PMOS transistor PT21, the NMOS transistor NT21, and the NMOS transistor NT22 in the sub word line driver SWD. Also, the third value and the fourth value may be different from the first value and the second value described above.

In order to raise the threshold voltages of the PMOS transistor PT21, the NMOS transistor NT21, and the NMOS transistor NT22 compared to the case at the normal temperature, the second bias voltage BV2 is applied to reduce a leakage current occurring due to a temperature increase at the off-state.

As described above, regardless of the first bias voltage BV1 applied to the first transistors TR1s, the semiconductor memory device 100 applies the optimized second bias voltages BV2 to the PMOS transistor PT21, the NMOS transistor NT21, and the NMOS transistor NT22 in the sub word line driver SWD so that operating speed may be improved and the defects occurring due to a temperature increase or a leakage current may be prevented. In this regard, in the semiconductor memory device 100 according to the disclosed embodiments, the power consumption may be reduced.

Figure 7:
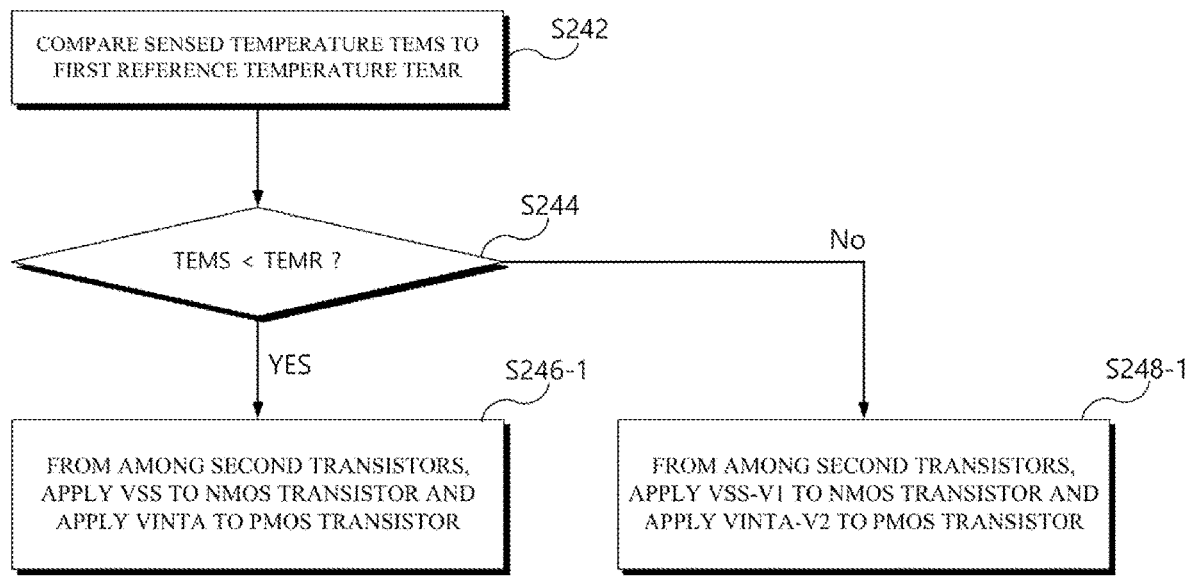
FIG. 7 is a flowchart illustrating a method of applying a second bias voltage in the bit line sense amplifier of FIG. 4 according to an example embodiment.

FIG. 7 is a flowchart illustrating a method of applying the second bias voltage BV2 in the bit line sense amplifier BLSA of FIG. 4 according to an example embodiment.

Referring to FIGS. 1, 4, and 7, the second bias voltage BV2 being applied to the second transistors TR2s of the core circuit may be a voltage different from that of the first bias voltage BV1 depending on the detected temperature of the semiconductor memory device 100. A method 700 illustrated in FIG. 7 includes detailed steps of the step S240 illustrated in FIG. 2.

In the method 700, a sensed temperature TEMS may be first compared to a first reference temperature TEMR, in operation S242. As a result of this comparison, when the sensed temperature TEMS is lower than the first reference temperature TEMR in operation S244 (if "YES"), the second bias voltage BV2 may be applied as the ground voltage VSS to the NMOS transistor NT11 and the NMOS transistor NT12 in the second transistors TR2s, and the second bias voltage BV2 may be applied as the operating voltage VINTA of the bit line sense amplifier BLSA to the PMOS transistor PT11 and the PMOS transistor PT12 in the second transistors TR2s in operation S246-1.

On the other hand, when the sensed temperature TEMS is compared to the first reference temperature TEMR in operation S242 and as a result of comparison, when the sensed temperature TEMS is greater than or equal to the first reference temperature TEMR in operation S244 (if "NO"), the second bias voltage BV2, which is lower by a first value v1 than the ground voltage VSS, may be applied to the NMOS transistor NT11 and the NMOS transistor NT12 in the second transistors TR2s, and the second bias voltage BV2, which is higher by a second value v2 than the operating voltage VINTA of the bit line sense amplifier BLSA, may be applied to the PMOS transistor PT11 and the PMOS transistor PT12 in the second transistors TR2s in operation S248-1. The first value v1 and the second value v2 may be the same as described above.

As described above, in the semiconductor memory device 100 according to the disclosed embodiments, the second bias voltages BV2 applied to the second transistors TR2s may be adaptively set so as to reduce a leakage current and consumed power and to improve operating reliability.

The applying of the second bias voltage BV2 in operation 800 illustrated in FIG. 7 may be applied as in the same manner as in the bit line sense amplifier BLSA of FIG. 5. That is, when the sensed temperature TEMS is lower than the first reference temperature TEMR in operation S244 (if "YES"), the ground voltage VSS may be applied as the second bias voltage BV2 to the first switch transistors ST1s through the third switch transistor ST3 of FIG. 5 in operation S246-1. On the other hand, when the sensed temperature TEMS is greater than or equal to the first reference temperature TEMR in operation S244 (if "NO"), the second bias voltage BV2, which is lower by the first value v1 than the ground voltage VSS, may be applied to the first switch transistors ST1s through the third switch transistor ST3 of FIG. 5 in operation S248-1.

Figure 8:
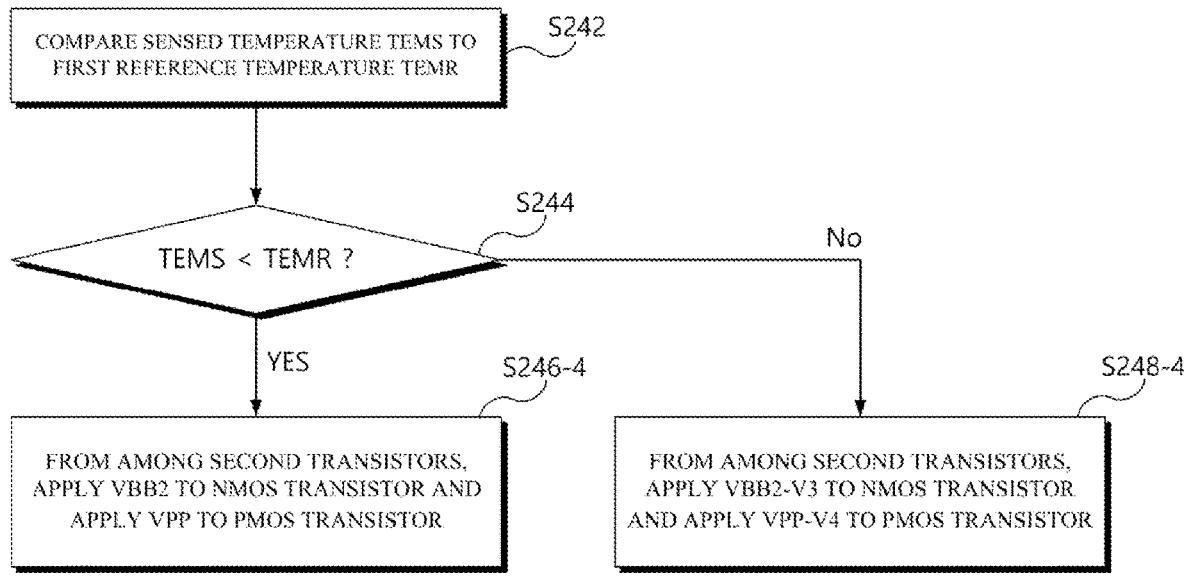
FIG. 8 is a flowchart illustrating a method of applying a second bias voltage in the sub word line driver of FIG. 6 according to an example embodiment.

FIG. 8 is a flowchart illustrating a method of applying the second bias voltage BV2 in the sub word line driver of FIG. 6 according to an example embodiment.

Referring to FIGS. 1, 6, and 8, in a method 800 of applying the second bias voltage BV2 to the second transistors TR2s of the core circuit, the second bias voltage BV2 may be applied as a voltage different from the first bias voltage BV1, in response to a change in temperature.

In the method 800, the sensed temperature TEMS may be first compared to the first reference temperature TEMR, in operation S242. As a result of this comparison, when the sensed temperature TEMS is lower than the first reference temperature TEMR in operation S244 (if "YES"), the power voltage VBB2 may be applied as the second bias voltage BV2 to the NMOS transistor NT21 and the NMOS transistor NT22 in the second transistors TR2s, and the boosted voltage VPP may be applied as the second bias voltage BV2 to the PMOS transistor PT21 in the second transistors TR2s in operation S246-4.

On the other hand, when the sensed temperature TEMS is compared to the first reference temperature TEMR in operation S242 and as a result of comparison, when the sensed temperature TEMS is greater than or equal to the first reference temperature TEMR in operation S244 (if "NO"), the second bias voltage BV2, which is lower by the third value v3 than the power voltage VBB2, may be applied to the NMOS transistor NT21 and the NMOS transistor NT22 in the second transistors TR2s, and the second bias voltage BV2, which is higher by the fourth value v4 than the boosted voltage VPP, may be applied to the PMOS transistor PT21 in the second transistors TR2s in operation S248-4. The third value v3 and the fourth value v4 may be the same as described above.

As described above, in the semiconductor memory device 100 according to the disclosed embodiments, the second bias voltages BV2 applied to the second transistors TR2s may be adaptively set so as to reduce a leakage current and consumed power and to improve operating reliability.

Referring back to FIGS. 1 and 2, in order to reduce a leakage current in a core circuit CC, it is illustrated above that the second bias voltage BV2 is applied to the second transistors TR2s of a core circuit CC adaptively to an operating condition or operating environment of the semiconductor memory device 100, regardless of the first bias voltage BV1. However, the present disclosure is not limited thereto. Regardless of the first bias voltage BV1, second bias voltages BV2, each having a different value, may be applied to the second transistors TR2s while in the off-state and the on-state.

Figure 9:
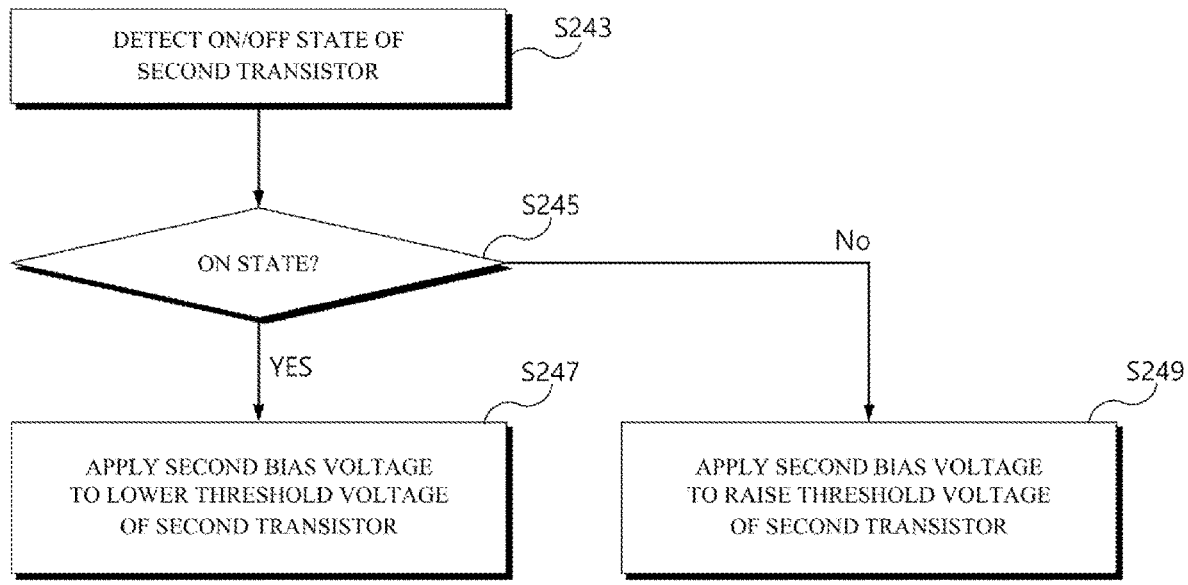
FIG. 9 is a flowchart illustrating a method of applying a second bias voltage according to a state of a second transistor according to an example embodiment.

FIG. 9 is a flowchart illustrating a method of applying the second bias voltage BV2 according to the state of the second transistor TR2 according to an example embodiment.

Referring to FIGS. 1 and 9, in the method 900 of applying the second bias voltage BV2 to the second transistors TR2s of the core circuit, the second bias voltage BV2 may be applied as a voltage different from the first bias voltage BV1 according to the state of the second transistors TR2.

For example, in order to apply the second bias voltage BV2 in the method 900, the on or off state of the second transistor TR2 may be detected in operation S243. As a result of detection, when the second transistor TR2 is in the on-state in operation S245 (if "YES"), the second bias voltage BV2, which may lower the threshold voltage of the second transistor TR2, may be applied, in order to realize a rapid operating speed, in operation S247. On the other hand, when the second transistor TR2 is in the off-state in operation S245 (if "NO"), the second bias voltage BV2, which may raise the threshold voltage of the second transistor TR2, may be applied, in order to prevent a leakage current in operation S249.

In other words, the second bias voltage BV2 applied to the NMOS transistor from among the second transistors TR2s is set to be high when the corresponding transistor is in the on-state compared to when the corresponding transistor is in the off-state, and the second bias voltage BV2 applied to the PMOS transistor from among the second transistors TR2s is set to be low when the corresponding transistor is in the on-state compared to when the corresponding transistor is in the off-state.

A difference in the second bias voltages BV2 applied to the second transistor TR2 in the on-state and the off-state may be the first value or the second value described above. Here, the first bias voltages BV1 may be the same regardless of the on-state or the off-state of the first transistor TR1.

As described above, in the semiconductor memory device 100 and the method 200 of operating the same according to the disclosed embodiments, the core circuit CC may operate by using the second bias voltage BV2 optimized for a required operating speed and power consumption.

Figure 10:
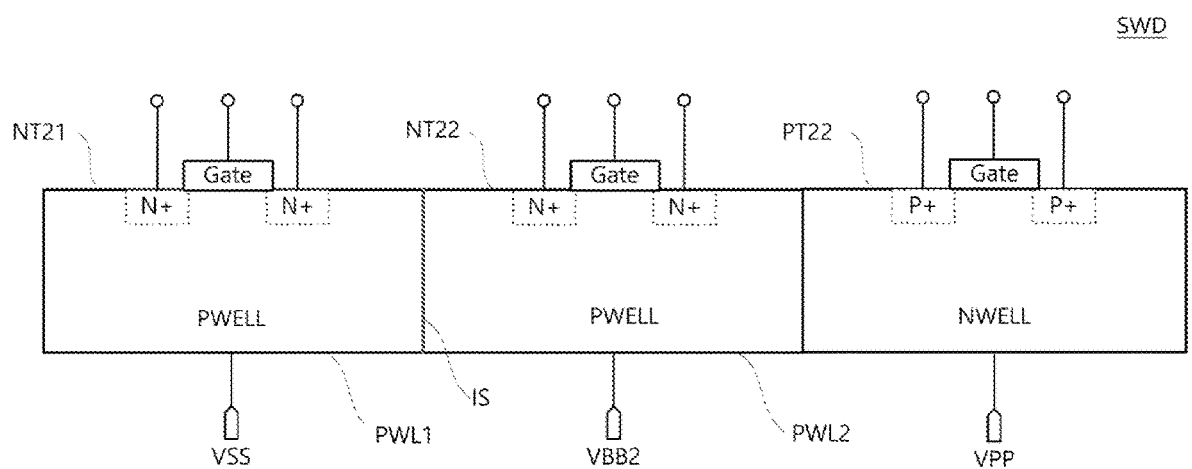
FIG. 10 illustrates a peripheral circuit of a semiconductor memory device according to an example embodiment.

FIG. 10 illustrates a peripheral circuit of the semiconductor memory device 100 according to an example embodiment.

Referring to FIGS. 1 and 10, in the core circuit CC of the semiconductor memory device 100 according to a disclosed embodiment, at least two different voltages may be applied to at least two second transistors TR2s included in a unit circuit from among the plurality of second transistors TR2s. The unit circuit is a circuit with the smallest unit, which may be repeatedly arranged in the core circuit CC. For example, the unit circuit may be the sub word line driver SWD of FIG. 10. Also, the unit circuit may be the bit line sense amplifier BLSA of FIG. 4. However, for convenience of description, hereinafter, it is illustrated that the unit circuit is the sub word line driver SWD of FIG. 10.

The sub word line driver SWD may include two NMOS transistors NT21 and NT22 and one PMOS transistor PT21 as illustrated in the circuit structure of FIG. 6. The second bias voltage BV2 applied to one of the two NMOS transistors NT21 and NT22 and the second bias voltage BV2 applied to the other one of the two NMOS transistors NT21 and NT22 may be different from each other.

Here, a P-well area formed on the second substrate SUB2 (shown in FIG. 3) may be separated into two portions, each including NMOS transistors NT21 and NT22. For example, the NMOS transistor NT21 may be formed on a first P-well PWL1 and the NMOS transistor NT22 may be formed on a second P-well PWL2. The first P-well PWL1 and the second P-well PWL2 may be separated from the P-well area by using a device isolation layer IS.

Each different second bias voltage BV2 may be applied to the first P-well PWL1 and the second P-well PWL2. The ground voltage VSS may be applied as the second bias voltage BV2 to the first P-well PWL1 including the NMOS transistor NT21 formed thereon and the back bias voltage VBB2 may be applied as the second bias voltage BV2 to the second P-well PWL2 including the NMOS transistor NT22 formed thereon.

In addition, an N-well area formed on the second substrate SUB2 may include the PMOS transistor PT21, and the boosted voltage VPP may be applied to the body of the PMOS transistor PT21.

Accordingly, the bias voltages optimized for operating characteristics of each different transistor of the same type may be applied. As such, in the semiconductor memory device 100 and the method 200 of operating the same according to the disclosed embodiments, the second bias voltage BV2 optimized for the peripheral circuit area 140 may be applied, regardless of the memory cell area 120 so that operating reliability of the semiconductor memory device 100 may be improved and power consumption of the semiconductor memory device 100 may be reduced.

Figure 11:
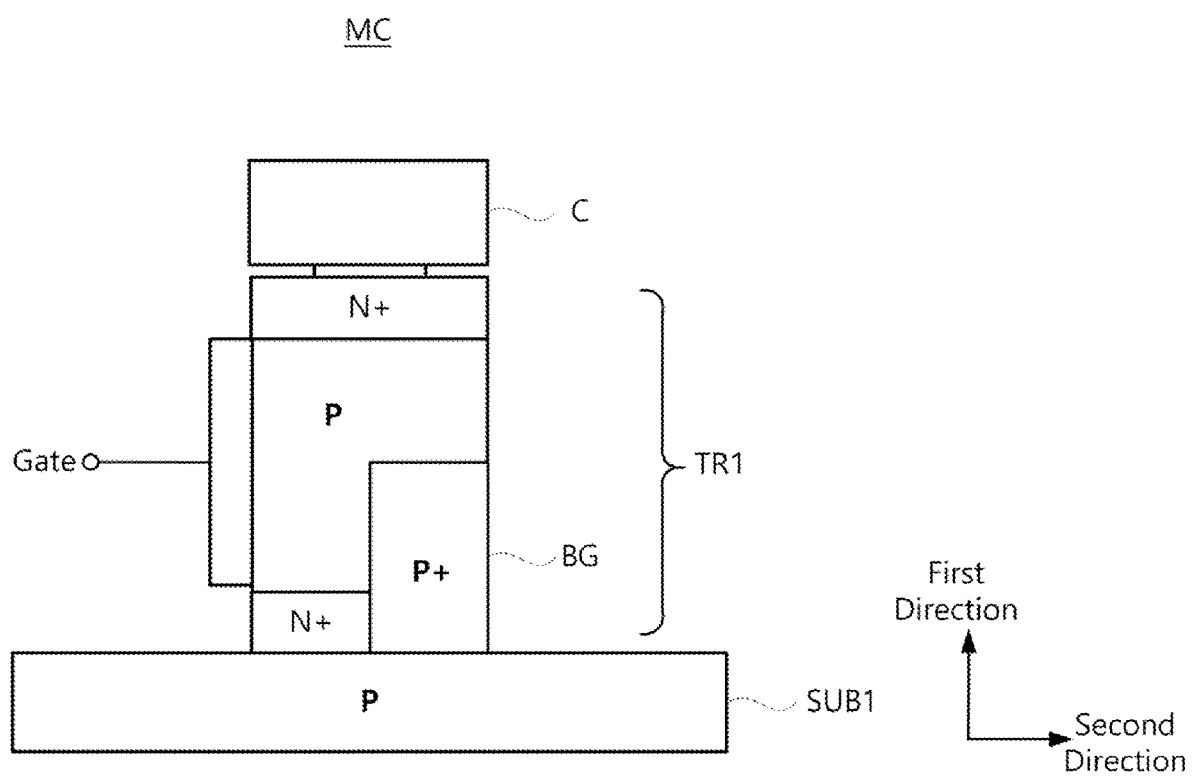
FIG. 11 illustrates a first transistor according to an example embodiment.

FIG. 11 illustrates the first transistor TR1 according to an example embodiment.

Referring to FIGS. 1 and 11, the first transistor TR1 may be a vertical channel transistor VCT formed in such a way that a channel extends in a vertical direction from the first substrate SUB1. Here, the first transistor TR1 may include a back gate BG and the first bias voltage BV1 may be applied to the back gate BG. As the first bias voltage BV1 is applied to the back gate BG, the first transistor TR1 in the form of the vertical channel transistor VCT may be controlled to be operated within a required operating range.

According to an embodiment, the first transistor TR1 may be disposed on the first substrate SUB1. The first substrate SUB1 may extend in a second direction. The first transistor TR1 may include NPN junction that extends in a first direction that is perpendicular to the second direction. That is, a first n-type semiconductor may be formed on the first substrate SUB1, a p-type semiconductor may be formed on the first n-type semiconductor, and a second n-type semiconductor may be formed on the p-type semiconductor. A gate of the first transistor TR1 may be disposed on the p-type semiconductor such that the gate is disposed on a side of the p-type semiconductor, and extend in the first direction. Here, for example, the n-type semiconductor may refer to an n-doped silicon, and the p-type semiconductor may refer to a p-doped silicon. However, the one or more embodiments are not limited thereto, and the first transistor TR1 may be formed of PNP junction, and may be include materials other than silicon. A capacitor C may be disposed on the second n-type semiconductor.

According to an embodiment, the back gate BG may be disposed on the first substrate SUB1 and may be disposed adjacent to the first n-type semiconductor. The back gate BG may extend into a part of the p-type semiconductor in the first direction. For example, the back gate BG may be formed such that a height of the back gate BG is greater than a height of the first n-type semiconductor. Thus, the back gate BG may penetrate into a portion of the p-type semiconductor. Here, the back gate BG may be used to apply the first bias voltage BV1 to a body of the first transistor TR1. However, the one or more embodiments are not limited thereto, and the back gate BG may be formed in various other ways to apply the first bias voltage BV1 to the body of the first transistor TR1.

As described above, the second bias voltage BV2 applied to the body of the second transistor TR2 may be controlled differently from the first bias voltage BV1.

Figure 12:
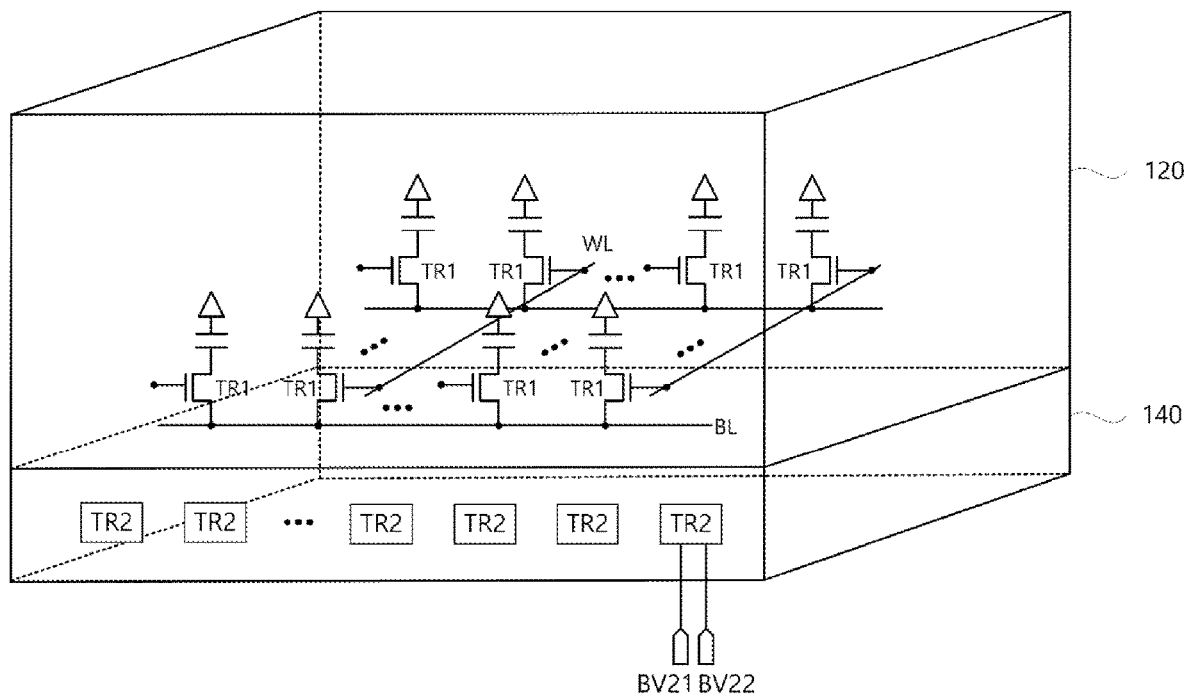
FIG. 12 illustrates a dynamic random access memory (DRAM) according to an example embodiment.
Figure 13:
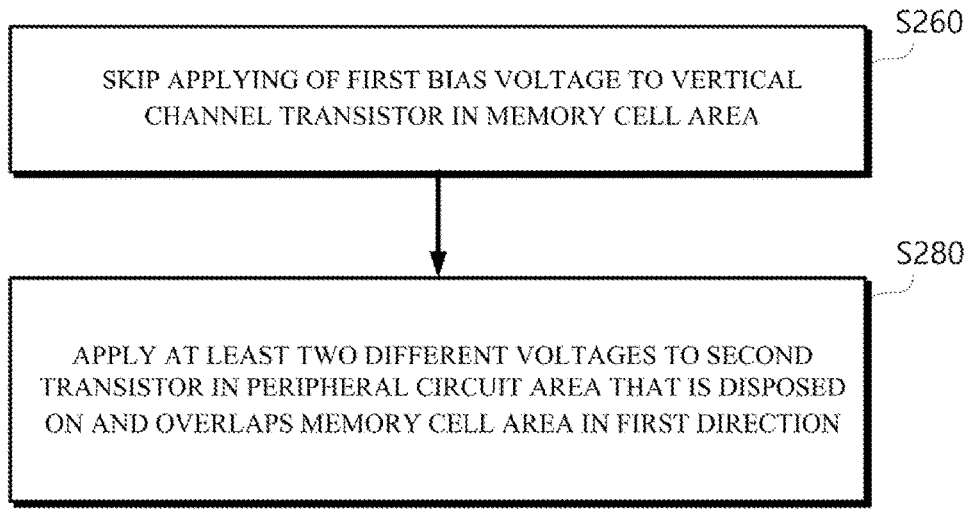
FIG. 13 is a flowchart illustrating an exemplary operating method in the DRAM of FIG. 12.

FIG. 12 illustrates a dynamic random access memory (DRAM) according to an example embodiment and FIG. 13 is a flowchart illustrating an operating method in the DRAM of FIG. 12.

Referring to FIGS. 12 and 13, the semiconductor device 100, which is the semiconductor memory device according to a disclosed embodiment, includes the memory cell area 120 and the peripheral circuit area 140 as illustrated in FIG. 1. That is, the memory cell area 120 may have a COP structure where the memory cell area 120 is stacked on and overlaps the peripheral circuit area 140.

However, unlike in the circuit of FIG. 1, the first transistor TR1 may be the vertical channel transistor VCT where the channel extends in the same direction (e.g., a vertical direction) in which the memory cell area 120 is stacked on the peripheral circuit area 140. Here, one or more first transistors TR1s may have the same structure shown in FIG. 11. Alternatively, one or more first transistors TR1s may be the vertical channel transistor VCT not including the back gate BG. For example, the first transistor TR1 of FIG. 12 may be the vertical channel transistor VCT formed of Indium Gallium Zinc Oxid (IGZO), instead of silicon. In this case, the first bias voltage BV1 may not be applied to the first transistor TR1 in operation S260.

Here, at least two different second voltages BV21 and BV22 may be applied to at least one second transistor TR2 from among a plurality of second transistors TR2s in the peripheral circuit area 140 in operation S280. That is, as the second bias voltages BV21 and BV22, which are different from each other, are applied to the second transistors TR2s, the semiconductor memory device 100 may be controlled adaptively to its operating condition or operational environment.

According to the disclosed semiconductor memory device and the method of operating the same, bias control on transistors of a memory cell and transistors of peripheral circuits varies and thereby, operating reliability of the semiconductor memory device may be secured in various operating conditions or operating environments.

Although some embodiments have been described in detail, those of ordinary skill in the art to which the present disclosure pertains will understand that various modifications are capable of being made to the above-described embodiments without departing from the scope the present disclosure.

For example, the semiconductor memory device 100 according to disclosed embodiments may be a High Bandwidth Memory (HBM) or a Compute Express Link (CXL) memory device, and the method 200 of operating the semiconductor memory device may be executed in a High Bandwidth Memory (HBM) or a Compute Express Link (CXL) memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
    a memory cell area including a plurality of memory cells, each of which includes a first transistor to which a first back bias voltage is applied and a capacitor connected to the first transistor and in which data is stored; and
    a peripheral circuit area which overlaps the memory cell area in a first direction and includes a plurality of second transistors to which a second back bias voltage controlled differently from the first back bias voltage is applied,
    wherein the second back bias voltage is different from the first back bias voltage, and
    wherein the second back bias voltage is applied to the plurality of second transistors in response to a temperature change of the semiconductor memory device.

2. The semiconductor memory device as claimed in claim 1,
    wherein the plurality of first transistors in the memory cell area is formed on a first substrate and the plurality of second transistors in the peripheral circuit area is formed on a second substrate, and
    wherein the first substrate is disposed at an upper part of the second substrate in the first direction.

3. The semiconductor memory device as claimed in claim 1, wherein
    a back bias voltage is applied as the first back bias voltage to a body of a first transistor among the plurality of first transistors, and
    a ground voltage, a power voltage, or an operating voltage is applied as the second back bias voltage to a body of a second transistor among the plurality of second transistors included in a core circuit.

4. The semiconductor memory device as claimed in claim 1, wherein, when second transistors among the plurality of second transistors are disposed in a bit line sense amplifier of the peripheral circuit area and the temperature of the semiconductor memory device is above a first reference temperature, the second back bias voltage having a voltage lower than a ground voltage by a first value, is applied to one or more NMOS transistors from among the second transistors, and the second back bias voltage having a voltage higher than an operating voltage of the bit line sense amplifier by a second value, is applied to one or more PMOS transistors from among the second transistors.

5. The semiconductor memory device as claimed in claim 4, wherein the first value and the second value are equal to each other.

6. The semiconductor memory device as claimed in claim 1, wherein, when second transistors among the plurality of second transistors are disposed in a bit line sense amplifier of the peripheral circuit area and the temperature of the semiconductor memory device is below a first reference temperature, a ground voltage is applied as the second back bias voltage to one or more NMOS transistors from among the second transistors and an operating voltage of the bit line sense amplifier is applied as the second back bias voltage to one or more PMOS transistors from among the second transistors.

7. The semiconductor memory device as claimed in claim 1, wherein when second transistors among the plurality of second transistors are disposed in a sub word line driver of the peripheral circuit area and the temperature of the semiconductor memory device is above a first reference temperature, the second back bias voltage having a voltage lower than a power voltage of the sub word line driver by a third value, is applied to one or more NMOS transistors from among the second transistors, and the second back bias voltage having a voltage higher than an operating voltage of the sub word line driver by a fourth value is applied to one or more PMOS transistors from among the second transistors.

8. The semiconductor memory device as claimed in claim 1, wherein when the second transistors are disposed in a sub word line driver of the peripheral circuit area and the temperature of the semiconductor memory device is below a first reference temperature, a power voltage of the sub word line driver is applied as the second back bias voltage to one or more NMOS transistors from among the second transistors and an operating voltage of the sub word line driver is applied the second back bias voltage to one or more PMOS transistors from among the second transistors.

9. The semiconductor memory device as claimed in claim 1, wherein the second back bias voltage has a different value based on each of the second transistors being in an off-state and an on-state.

10. The semiconductor memory device as claimed in claim 9, wherein the first back bias voltage applied to the first transistors is the same in an off-state and an on-state.

11. The semiconductor memory device as claimed in claim 2, wherein the second back bias voltage is applied as a first voltage value to at least one of the second transistors and the second back bias voltage is applied as a second voltage value to at least one of the second transistors, and
    wherein the second transistors are included in a unit circuit.

12. The semiconductor memory device as claimed in claim 11, wherein the second transistors included in the unit circuit include at least two separated well areas of the same type formed on the second substrate where the peripheral circuit area is disposed.

13. The semiconductor memory device as claimed in claim 1, wherein the first transistor is a vertical channel transistor including a back gate.

14. A method of operating a semiconductor memory device having a cell on periphery structure, in which a memory cell area and a peripheral circuit area are stacked and overlapped in a first direction, the method comprising:
    applying a first back bias voltage to a first transistor, included in each of a plurality of memory cells included in the memory cell area, in response to a first instruction; and
    applying a second back bias voltage, which is different from the first back bias voltage, to second transistors performing an operation corresponding to the first instruction in the peripheral circuit area, wherein the second back bias voltage is applied to the second transistors in response to a temperature change of the semiconductor memory device, and wherein each of the plurality of memory cells includes the first transistor and a capacitor connected to the first transistor.

15. The method as claimed in claim 14, wherein the second transistors are disposed in a bit line sense amplifier of the peripheral circuit area, and the applying of the second back bias voltage includes:

comparing a sensed temperature to a first reference temperature;

when the sensed temperature is lower than the first reference temperature, applying a ground voltage as the second back bias voltage to a NMOS transistor from among the second transistors as a ground voltage and applying an operating voltage of the bit line sense amplifier as the second back bias voltage to a PMOS transistor from among the second transistors; and when the sensed temperature is higher than the first reference temperature, applying the second back bias voltage having a voltage lower than the ground voltage by a first value, to the NMOS transistor from among the second transistors and applying the second back bias voltage having a voltage higher than the operating voltage of the bit line sense amplifier by a second value, to the PMOS transistor from among the second transistors.

16. The method as claimed in claim 14, wherein the second transistors are disposed in a sub word line driver of the peripheral circuit area, and the applying of the second back bias voltage includes:

comparing a sensed temperature to a first reference temperature;

when the sensed temperature is lower than the first reference temperature, applying a back bias voltage as the second back bias voltage to a NMOS transistor from among the second transistors and applying a boosted voltage as the second back bias voltage to a PMOS transistor from among the second transistors; and when the sensed temperature is higher than the first reference temperature, applying the second back bias voltage having a voltage lower than the back bias voltage by a third value, to the NMOS transistor from among the second transistors and applying the second back bias voltage having a voltage higher than the boosted voltage by a fourth value, to the PMOS transistor from among the second transistors.

17. The method as claimed in claim 14, wherein, in the applying of the second back bias voltage, the second back bias voltage has a different value based on each of the second transistors being in an off-state and an on-state.

18. The method as claimed in claim 14, wherein, in the applying of the second back bias voltage, the second back bias voltage is applied as a first voltage value to at least one of the second transistors and the second back bias voltage is applied as a second voltage value to at least one of the second transistors.

* * * * *